United States Patent
Jaiprakash et al.

(10) Patent No.: US 7,015,092 B2
(45) Date of Patent: Mar. 21, 2006

(54) METHODS FOR FORMING VERTICAL GATE TRANSISTORS PROVIDING IMPROVED ISOLATION AND ALIGNMENT OF VERTICAL GATE CONTACTS

(75) Inventors: Venkatachalam C. Jaiprakash, Fremont, CA (US); Norbert Arnold, Essex, VT (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/740,026

(22) Filed: Dec. 18, 2003

(65) Prior Publication Data

US 2005/0136631 A1 Jun. 23, 2005

(51) Int. Cl.
*H01L 21/8242* (2006.01)

(52) U.S. Cl. ...................... 438/248; 438/270

(58) Field of Classification Search ............... 438/243, 438/244, 248, 268, 270, 387, 391, 589
See application file for complete search history.

(56) References Cited

U.S. PATENT DOCUMENTS

| 6,143,599 | A * | 11/2000 | Kim et al. | 438/243 |
| 6,406,970 | B1 * | 6/2002 | Kudelka et al. | 438/386 |
| 6,432,774 | B1 * | 8/2002 | Heo et al. | 438/270 |
| 6,534,359 | B1 * | 3/2003 | Heo et al. | 438/243 |

* cited by examiner

*Primary Examiner*—Chandra Chaudhari
(74) *Attorney, Agent, or Firm*—Edell, Shapiro & Finnan, LLC

(57) ABSTRACT

Methods and devices that provide improved isolation and alignment of gate conductors or gate contacts of vertical transistors in deep trench memory cells. A method for forming a vertical gate contact of a vertical transistor includes an oxide spacer formation process that prevents defects, such as shorts caused by voids filled with polysilicon, resulting from etching processes that are performed during fabrication of a vertical transistor, and enables formation of well-defined contact plugs for gate contacts, providing improved alignment structures.

15 Claims, 14 Drawing Sheets

METHODS FOR FORMING VERTICAL GATE TRANSISTORS PROVIDING IMPROVED ISOLATION AND ALIGNMENT OF VERTICAL GATE CONTACTS

TECHNICAL FIELD

The present invention relates generally to methods for manufacturing semiconductor devices including vertical transistors. More specifically, the invention relates to methods and devices for providing improved isolation and alignment of gate conductors/contacts of vertical transistors in deep trench memory cells.

BACKGROUND

Semiconductor memories, such as dynamic random access memories (DRAMs) comprise an array of memory cells that are interconnected by rows (wordlines) and columns (bit lines). In general, the memory cells comprise storage nodes that are formed within deep trenches etched into a semiconductor substrate. The storage nodes are accessed using a transistor, which allows a charge to be stored in the storage node or to be retrieved from the storage node, depending on the desired action (i.e., read or write).

In general, a transistor of a DRAM memory cell comprises two diffusion regions isolated from one another by a channel which is controlled by a gate. Depending on the direction of the flow of current, one diffusion region is called the drain region and the other diffusion region is called the source region. One of the diffusion regions is connected to a bit line, the other diffusion region is connected to the cell capacitor (storage node), and the gate is connected to a word line. By applying suitable voltages to the gate, the transistor is controlled such that a flow of current between the diffusion regions through the channel is turned on and off.

Typically, a DRAM memory cell comprises a MOSFET (metal oxide semiconductor field effect transistor) connected to a capacitor. There are different types of MOSFETs. A planar MOSFET is a transistor where a surface of the channel region of the transistor is generally parallel to the primary surface of the substrate. A vertical MOSFET is a transistor where a surface of the channel region of the transistor is generally perpendicular to the primary surface of the substrate.

Due to technological advancements that enable fabrication of increasingly smaller memory device components, the integration density of memory cells is continuously increasing. With increasing density, planar transistors (such as MOSFETS) in trench storage memory devices are limited in terms of scalability due to the critical dimension of the gate length having to be no less than about 110 nm, to avoid performance degradation or sensitivity to process tolerances.

Accordingly, to utilize the available area effectively, state of the art trench capacitor DRAMs have been implemented using memory cells with vertical transistors, wherein a transistor is stacked above a trench capacitor. Vertical transistors provide significant scalability, especially below minimum feature sizes of about 100 nm. This is due in part to the vertical channel length for the vertical transistor being decoupled from the minimum design ground rule.

Various techniques have been developed for forming vertical transistors for semiconductor memory cells. As with all new technologies, however, opportunities exist for improving the structure and process of integration of memory cells comprising vertical transistors. One area for improvement in the design of a vertical transistor concerns effectively isolating the vertical gate conductor from shorting to, e.g., a bitline contact (or other upper layers). More specifically, it is very important to provide proper separation between the vertical gate conductor which connects to a wordline, for example, and a bitline contact which contacts a diffusion region (drain/source) adjacent the vertical gate conductor.

FIGS. 1A–1H illustrate a conventional method for forming a memory cell comprising a vertical transistor device and deep trench capacitor. FIG. 1A schematically illustrates a cross-sectional view of memory cell at an intermediate stage of fabrication of the memory cell. In particular, FIG. 1A illustrates a silicon substrate (1) which comprises a P-substrate (2), which has undergone various processes such as deep trench processing, buried strap formation, active area processing, ion dopant implantation, etc., using one or more methods known to those of ordinary skill in the art, to form a buried N well (3), P well (4) (or device well), a deep trench (5), a buried plate (10), collars (12), a node dielectric (13), a storage node (14), a buried strap (15), a TTO (trench top oxide) (16), buried strap diffusion regions (17), bitline diffusion regions (18), a pad oxide layer (11), a pad nitride layer (19) and a gate oxide layer (20).

The deep trench (5) is formed in the substrate (1) using conventional processes well-known to those of ordinary skill in the art. For example, as is known in the art, a mask oxide layer (not shown) can be formed over the pad stack (e.g., pad nitride (19) and pad oxide (11)) and patterned for use as an etch mask for etching an array of deep trenches in the substrate (1). The trench (5) is etched to about 5 um to about 10 um below the surface of the substrate (1). The substrate (1) may comprise a monocrystalline substrate (silicon, SiGe, GaAs, etc.) which is doped to form P-well (4), which is the exemplary embodiment is a device well.

FIG. 1A illustrates a trench capacitor that is formed in a lower portion of the trench (5) below the trench top oxide (16). In particular, the trench capacitor comprises storage node (14), which represents a first capacitor plate, buried plate (10), which represent a second capacitor plate, and the node dielectric (13). Various methods for forming the trench capacitor are well-known in the art. Briefly, after the trench (5) is formed, the buried plate (10) is formed by diffusing N+ dopants out from a dopant source into a portion of the substrate (1) surrounding the lower portion of the trench (5). The node dielectric layer (13) is conformally deposited and etched to line bottom of the trench (5). The node dielectric (13) may be a nitride oxide layer or any other material suitable for use as a capacitor dielectric.

The oxide collars (12) are formed on the sidewalls of the trench (5) using LOCOS (localized silicon oxidation), TEOS deposition, or other collar forming methods known in the art. The trench (5) is filled with a conductive material such as polycrystalline silicon (poly) or amorphous silicon, N+ doped polysilicon, to form the storage node (14). The storage node (14) and oxide collars (12) are recessed/planarized to a desired depth and the buried strap (15) is formed. The buried strap (15) provides a connection between the storage node (14) and the P well (4) regions of the substrate (10). The oxide collars (12) act to isolate contact of the N+ polysilicon (14) to the substrate (1).

The TTO (trench top oxide) (16) is formed on top of the buried strap (15) to provide isolation between the storage node (14) and a gate conductor (shown in FIG. 1B) of a vertical transistor, which is formed in the upper portion of the trench (5) above the TTO (16). Methods for forming the TTO layer (16) are well-known in the art. For instance, an oxide (silicon dioxide) is deposited on horizontal surfaces using HDP (high density plasma) process, whereby oxide deposition fills in from the bottom to the top, to form an oxide layer over the polysilicon (14) in the trench (5) and on the horizontal surfaces of the substrate. Other portions of the deposited oxide are removed by planarizing the surface of the semiconductor device and/or by recessing the oxide using a wet etch to leave about a 30–50 nm thick oxide layer at the bottom of the recess, which forms the trench top oxide (16).

As is known in the art, the buried strap (15) is used to form the strap diffusion regions (17), whereby dopants from the buried strap (15) region of the polysilicon storage node (14) are outdiffused into the P-well (4) portion of the substrate (1) during a thermal process. It is preferable for the strap diffusion regions (17) to overlap the TTO (16) to be at least coincident with the edge of a vertical gate conductor (e.g., gate conductor (21) shown in FIG. 1B) of the vertical transistor.

The strap diffusion regions (17) essentially act as source/drain terminals for a vertical transistor. More specifically, the strap diffusion regions (17) are access nodes to the storage node (14), providing electrical connection between a vertical transistor and the storage node (14). A diffusion region (17) is electrically connected to a bitline diffusion region (18) via a vertical transistor channel (not shown) which is formed in the P well (4) of the substrate (1) extending along the gate oxide (20) on the sidewalls of the upper portion of the trench (5) above the TTO (16), when the vertical transistor is activated. The channel must be electrically isolated from the vertical gate conductor. Therefore, an insulating layer is provided, typically an oxide layer formed by oxidizing single crystalline silicon within the deep trench and the channel.

A vertical transistor is formed in the region of the substrate above the TTO (16), which separates the vertical transistor from the buried strap (15). In particular, FIG. 1A illustrates an intermediate stage of fabrication of a memory cell where various components of a vertical transistor are formed. For instance, the bit line diffusion regions (18) are formed in the substrate (5) by implanting dopants (preferably N+ dopants, although other dopants may be used depending on the design) using methods known to those of ordinary skill in the art.

The gate oxide layer (20) (gate dielectric) is formed on the vertical sidewalls of the upper portion (vertical gate region) of the trench (5) (and optionally on top of the TTO (16)) using, e.g., a furnace oxidation process or any other suitable process depending on the type of oxide used. For example, the gate dielectric (20) can be formed by heating the substrate in the presence of oxygen to form an oxide layer on the exposed surfaces of the substrate, an in particular, the vertical sidewalls of the trench (5). During this thermal process, the strap diffusion regions (17) may be formed. Moreover, during this process, the surface of the pad nitride (19) is oxidized, which can lead to device failures as described later.

Referring now to FIG. 1B, after the gate dielectric (20) is formed on the vertical trench sidewalls, a gate polysilicon (21) (or gate poly fill) is formed in the upper portion of the trench (5) (i.e., the vertical gate region) above the TTO (16). The gate polysilicon (21) can be formed by depositing a layer of polysilicon over the substrate to fill the entire upper portion of the trench (5). For instance, N+ doped polysilicon can be deposited using an in situ CVD (chemical vapor deposition) process such as LPCVD (low pressure CVD). Alternatively, intrinsic polysilicon can also be deposited by CVD techniques, and subsequently doped to form N+ doped polysilicon within the vertical gate region. The polysilicon is then etched back using a poly recess method known to those of ordinary skill in the art. For instance, a CMP (chemical mechanical polish) process is performed to planarize the substrate to the top surface of the pad nitride (19). The remaining polysilicon is then recessed using a wet etch that is selective to the pad nitride (19) (or RIE (reactive ion etch), such that the polysilicon is recessed to a desired level below the surface of the substrate (1).

The result of such process (as shown in FIG. 1B) is formation of the gate polysilicon (21), which is recessed below the substrate (1) surface to a level that overlaps the diffusion regions (18). An oxidation process can then performed to oxidize the surface of the polysilicon (21), which forms an oxidation layer (not shown) that can be used as an etch stop in a subsequent process of spacer formation. This process further oxidizes the surface of the pad nitride layer (19).

Referring to FIG. 1C, a conformal layer of nitride (22) is deposited over the substrate (1) such that the conformal nitride layer (22) occupies about ⅔ of the width of the trench. The conformal nitride layer (22) can be formed using LPCVD, for example, or other methods known to those of ordinary skill in the art.

Referring to FIG. 1D, nitride spacers (23) are formed on the vertical sidewalls of the trench above the gate poly fill (21) and on the vertical sidewalls of the pad nitride (19). For example, the nitride spacers (23) can be formed by etching the conformal nitride layer (22) down to the pad nitride (19) and the gate poly fill (21) layers using an anisotropic etch process, such as RIE (Reactive Ion Etching). As is known in the art, such nitride etch process results in nitride spacers (23) having a rounded upper edge (not a true vertical rise). Furthermore, the nitride spacer formation process results in formation of an aperture (24) down to the surface of the poly fill (21).

Referring to FIG. 1E, a poly contact plug (25) is formed in the aperture (24). The poly contact plug (25) can be formed by depositing a layer of polysilicon over the substrate to fill the aperture (24) followed by an etching or recess process to etch back the polysilicon layer to the top of the pad nitride (19), thereby forming the poly contact plug (25). The poly contact plug (25) may be etched back to be at or below the surface of the pad nitride (19). The gate contact plug (25) and gate poly fill (21) form the vertical gate conductor of a vertical transistor. In subsequent processing steps, the contact plug (25) is electrically connected to, e.g., a wordline.

Referring to FIG. 1F, a pad nitride strip process is performed to remove the pad nitride (19). For example, an isotropic wet etch process is performed for stripping pad nitride (19). In this process, the nitride spacer (23) is also removed forming a divot (23a) (or spacer region). As depicted in FIG. 1F, the conventional process results in formation of a filament (19a) that dangles over the divot (23a). The filament (19a) comprises oxidized nitride, which results from the oxidation of the vertical sidewalls of the pad nitride (19) during previous processing steps for forming the gate oxide (20) on the trench sidewalls and/or the oxidation layer over the poly fill layer (21).

Referring to FIG. 1G, after removal of the pad nitride (19) and nitride spacers (23), a nitride refill process is performed by isotropically depositing a layer of silicon nitride (26) to fill the divot around the plug (25). However, as depicted in FIG. 1G, the filament (19a) prevents the proper divot fill of the spacer nitride, resulting in voids (27) in the nitride that fills the divot (23a). More specifically, the combination of the filament (19a) and flared upper portion of the contact plug (25) reduces the opening to the divot (23a), which can prevent proper divot fill resulting in the formation of voids (27).

Referring to FIG. 1H, the nitride refill layer (26) is anisotropically etched using, e.g., RIE, to remove the nitride layer (26) down to the pad oxide (11) and form a nitride spacer (26a). In this process, the filament (19a) is substantially or completely removed. The result of the conventional process as depicted in FIG. 1H is nitride spacer (26a) having voids (27) formed therein. The process continues using methods well-known to those of ordinary skill in the art to connect the vertical gate conductor to a wordline and connecting one or both of the bitline diffusion regions (18) to a bitline.

There are various disadvantages associated with the conventional process described above with respect to isolation and alignment of the vertical gate conductor, which can cause defects in the memory cell that result in electrical shorts (e.g., connection between the vertical gate conductor (wordline) and bitline). For instance, the conventional process described above can cause oxidation of the vertical sidewalls of the pad nitride (19), which as depicted in FIG. 1H, can result in the formation of a filament (19a) overhanging the spacer region or divot (23a) which is be filled with nitride. The filament (19a) can prevent the proper divot fill of the spacer nitride when the layer of nitride (26) is deposited, resulting in voids (27) in the resulting nitride spacers (26a) (FIG. 1H). These voids (27) may be filled with polysilicon in subsequent deposition steps which can lead to shorts between the gate (wordline) and bitline.

Moreover, as shown in FIG. 1E, for example, the vertical gate conductor contact plug (25) which is formed between nitride spacers (23) does not have vertical sidewalls and the plug (25) is wider at its top surface due to the rounded upper surface of the nitride spacers (23). Since the width (or diameter) of the upper surface of the contact plug (25) is not well-defined, misalignments can occur between the gate contact plug (25) and wordline, which can result in shorts.

Accordingly, there is a need for an improved method of forming a vertical transistor, which overcomes the above problems of creating shorts due to voids in nitride spacers being filled with polysilicon and misalignment of the wordline and vertical gate contacts.

SUMMARY OF THE INVENTION

Exemplary embodiments of the invention generally include vertical transistor devices and methods for manufacturing vertical transistors. Exemplary embodiments of the invention further include methods and devices for providing improved isolation and alignment of gate conductors or gate contacts of vertical transistors in deep trench memory cells. In general, methods for forming vertical transistors according to exemplary embodiments of the invention include methods for forming vertical gate contacts using an oxide spacer formation process that prevents defects, such as shorts caused by voids filled with polysilicon, resulting from etching processes that are performed during fabrication of a vertical transistor. In addition, methods for forming vertical transistors according to exemplary embodiments of the invention include an oxide spacer formation process that enables the formation of well-defined poly plugs for gate contacts, providing improved alignment structures.

In one embodiment of the invention, a method for forming a vertical gate contact structure comprises forming a trench in a semiconductor substrate, forming a gate oxide on sidewalls of the trench and depositing a conformal layer of conductive material to cover the substrate and underfill the trench with the conductive material, wherein the conformal layer of conductive material forms a first aperture in a central region of the trench, the first aperture extending from a top surface of the conformal layer of conductive material into the trench. A nitride plug is then formed in the first aperture and the conformal layer of conductive material is etched back to recess the conductive material underfill in the trench to a depth below a surface of the semiconductor substrate to form a divot. The divot is then filled with an oxide material to form an oxide spacer, and the nitride plug is removed to form a second aperture in the central region of the trench, which extends from a top surface of the oxide spacer into the trench. A gate contact plug is then formed in the second aperture, wherein the gate contact plug contacts the conductive material underfill in the trench.

These and other exemplary embodiments, aspects, objects, features and advantages of the present invention will be described or become apparent from the following detailed description of exemplary embodiments, which is to be read in connection with the accompanying drawings.

BRIEF DESCRIPTION OF THE DRAWINGS

FIGS. 1A–1H illustrate a conventional method for forming a memory cell comprising a vertical transistor and deep trench capacitor, wherein:

FIG. 1A schematically illustrates a cross-sectional view of the memory cell at an intermediate stage of fabrication of the memory cell in which a trench capacitor and portions of a vertical transistor are formed;

FIG. 1B is a cross-sectional view of the structure of FIG. 1A illustrating a gate poly fill that is formed in an upper portion (vertical gate region) of the trench;

FIG. 1C is a cross-sectional view of the structure of FIG. 1B illustrating conformal nitride layer that is deposited to form nitride spacers;

FIG. 1D is a cross-sectional view of the structure of FIG. 1C illustrating nitride spacers that are formed on vertical sidewalls of the trench above the gate poly fill and on vertical sidewalls of a pad nitride by etching the conformal nitride layer;

FIG. 1E is a cross-sectional view of the structure of FIG. 1D illustrating a gate contact plug, which is formed in an aperture between the nitride spacers;

FIG. 1F is a cross-sectional view of the structure of FIG. 1E after removal of a pad nitride and the nitride spacer, illustrating formation of a filament that is formed over a divot region; and FIG. 1G is a cross-sectional view of the structure of FIG. 1F after deposition of a nitride layer for filling the divot region, illustrating the formation of voids in the nitride spacer region; and FIG. 1H is a cross-sectional view of the structure of FIG. 1G after etching of nitride layer to form nitride spacers, illustrating a defect in the conventional process due to voids formed in the nitride spacers.

FIGS. 2A–2F illustrate a method according to an exemplary embodiment of the invention for forming a memory cell comprising a vertical transistor and deep trench capacitor, wherein:

FIG. 2A schematically illustrates a cross-sectional view of a memory cell according to an exemplary embodiment of the invention at an intermediate stage of fabrication of the memory cell wherein a conformal layer of polysilicon is deposited to underfill the trench with gate poly for a gate conductor;

FIG. 2B is a cross-sectional view of the structure of FIG. 2A according to an exemplary embodiment of the invention, illustrating a nitride plug that is formed in an aperture formed by the conformal layer of polysilicon;

FIG. 2C is a cross-sectional view of the structure of FIG. 2B according to an exemplary embodiment of the invention, illustrating the polysilicon underfill in the trench recessed to a level below the surface of the substrate to form spacer divots;

FIG. 2D is a cross-sectional view of the structure of FIG. 2C according to an exemplary embodiment of the invention, illustrating oxide spacers that are formed in the spacer divots;

FIG. 2E is a cross-sectional view of the structure of FIG. 2D according to an exemplary embodiment of the invention, illustrating a contact plug aperture that is formed after selectively etching the nitride plug and pads to remove such nitride plug and pads; and FIG. 2F is a cross-sectional view of the structure of FIG. 2E according to an exemplary embodiment of the invention, illustrating a gate contact plug that is formed in the contact plug aperture by deposition and etch back of a polysilicon layer.

DETAILED DESCRIPTION OF EXEMPLARY EMBODIMENTS

In general, FIGS. 2A–2F illustrate a method for forming a vertical transistor device according to an exemplary embodiment of the invention. FIGS. 2A–2F further illustrate a method according to an exemplary embodiment of the invention for forming a deep trench memory cell comprising a vertical transistor and deep trench capacitor.

Figure 1A:
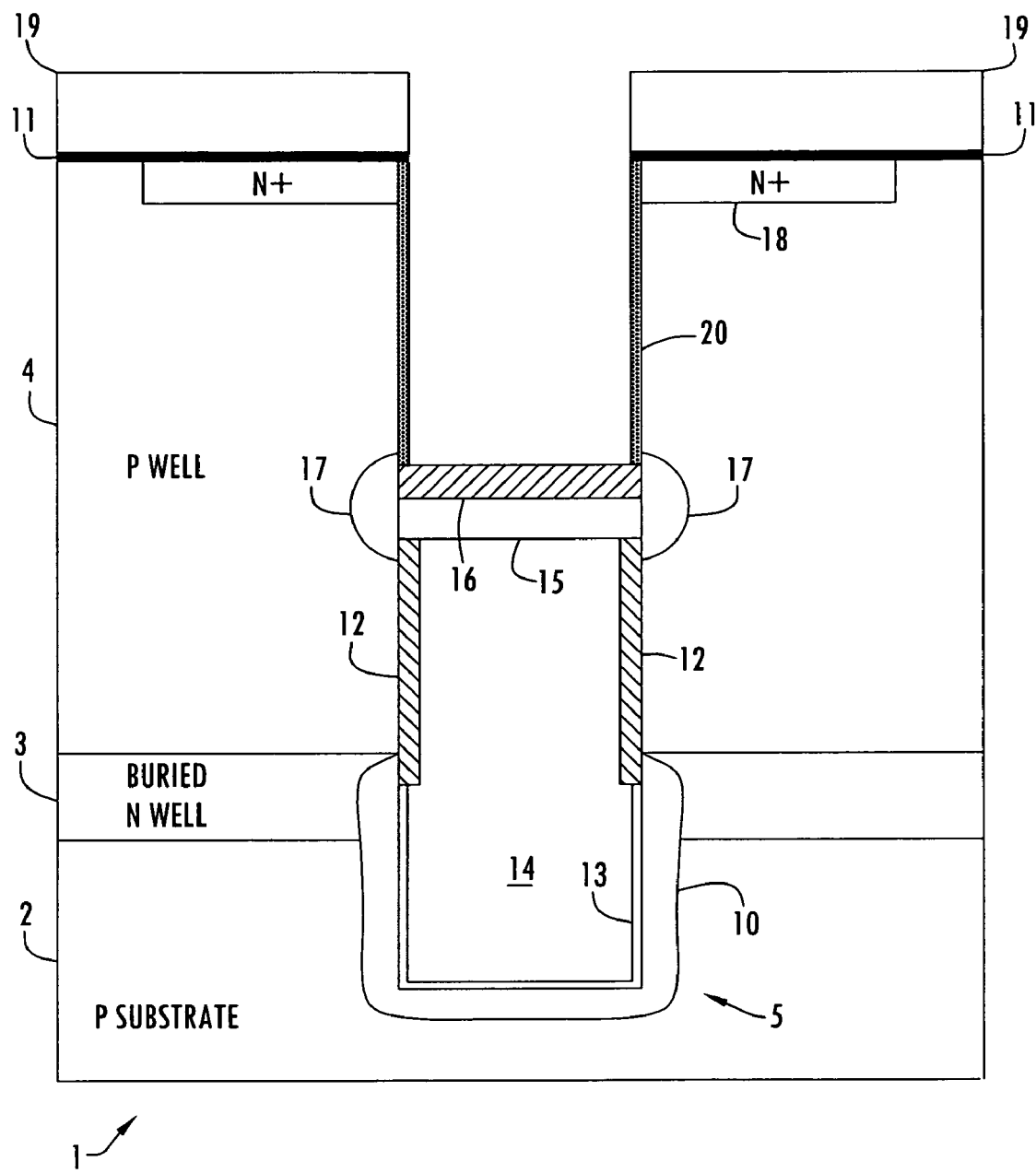
Figure 2A:
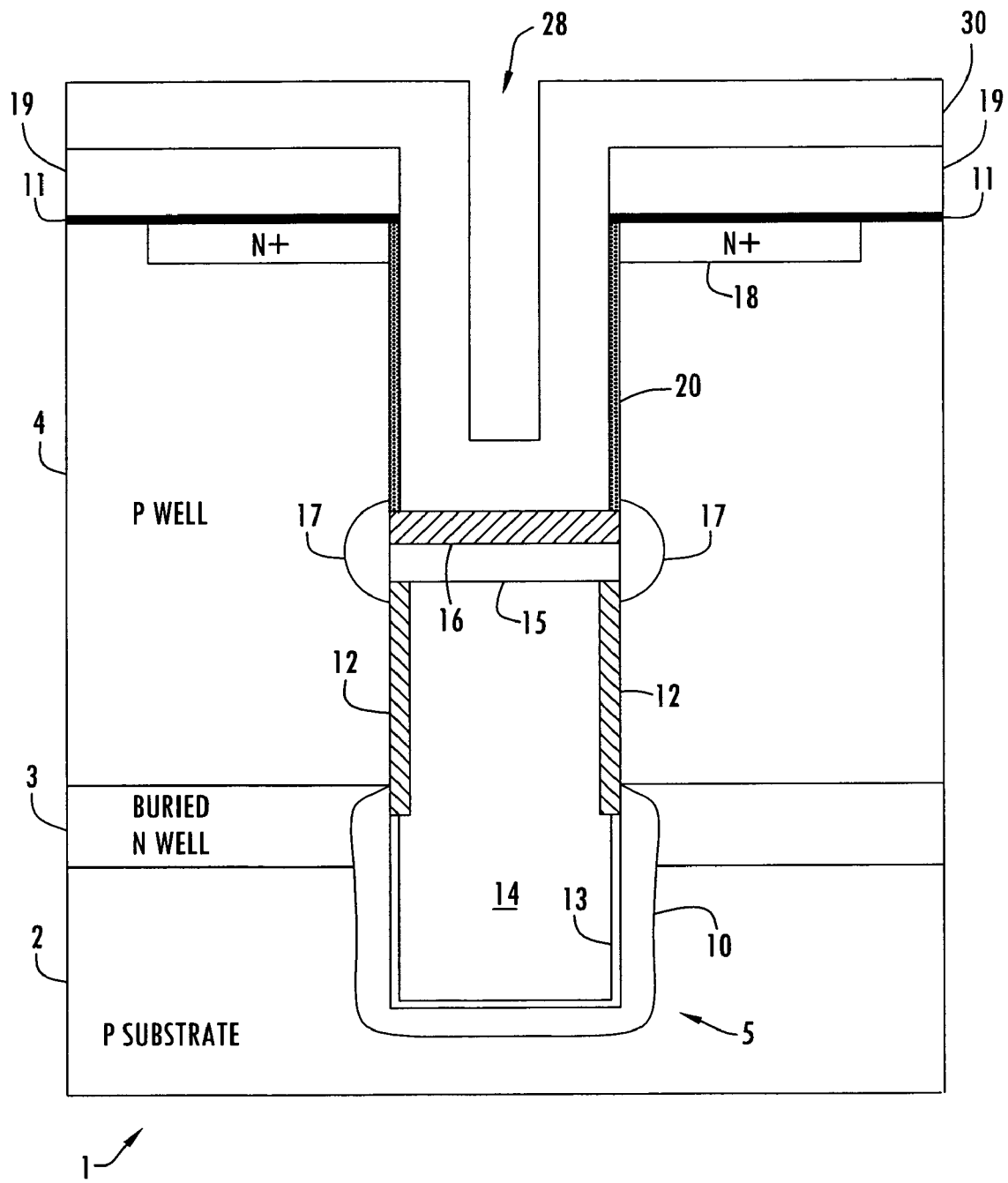

Referring to FIG. 2A, a method for forming a vertical gate transistor device of a deep trench memory cell according to an exemplary embodiment of the invention comprises forming a memory cell structure in a substrate (1), which comprises a P-substrate (2), a buried N well (3), and a P well (4) (or device well), wherein the memory cell comprises a deep trench (5), a buried plate (10), collars (12), a node dielectric (13), a storage node (14), a buried strap (15), a TTO (trench top oxide) (16), buried strap diffusion regions (17), bitline diffusion regions (18), a pad oxide layer (11), a pad nitride layer (19) and a gate oxide layer (20). It is to be understood that the structure in FIG. 2A can be formed using any suitable fabrication methods that are known to those of ordinary skill in the art, such as the methods described above with reference to FIG. 1A. It is to be further understood that although exemplary embodiments are described herein with respect to vertical transistors for deep trench memory cells, the methods of the invention are applicable to any semiconductor device that comprises a vertical transistor.

Moreover, in accordance with an exemplary embodiment of the invention as depicted in FIG. 2A, a method for forming a vertical transistor comprises depositing a conformal layer of polysilicon (30) to form a polysilicon underfill layer (or "poly underfill") for a gate conductor in the vertical gate region of the trench (5). More specifically, after an array gate oxidation is performed to form oxide layer (20) (gate dielectric) on the vertical sidewalls of the trench (5), a conformal layer of polysilicon (30) is deposited over the pad nitride (19), the sidewalls of the trench (5) and the top of the TTO (16).

In one exemplary embodiment, the conformal polysilicon layer (30) is deposited such that the thickness of such layer (30) on the trench sidewalls is about 0.3 F, i.e., ⅓ the feature size or ⅓ the width W of the trench (5), leaving an aperture (28) in a center region of the trench (5) which has a width that is about ⅓ the width W of the trench (5). In one exemplary embodiment of the invention the trench (5) width is W=110 nm and the trench depth is about 7 um.

Figure 1B:
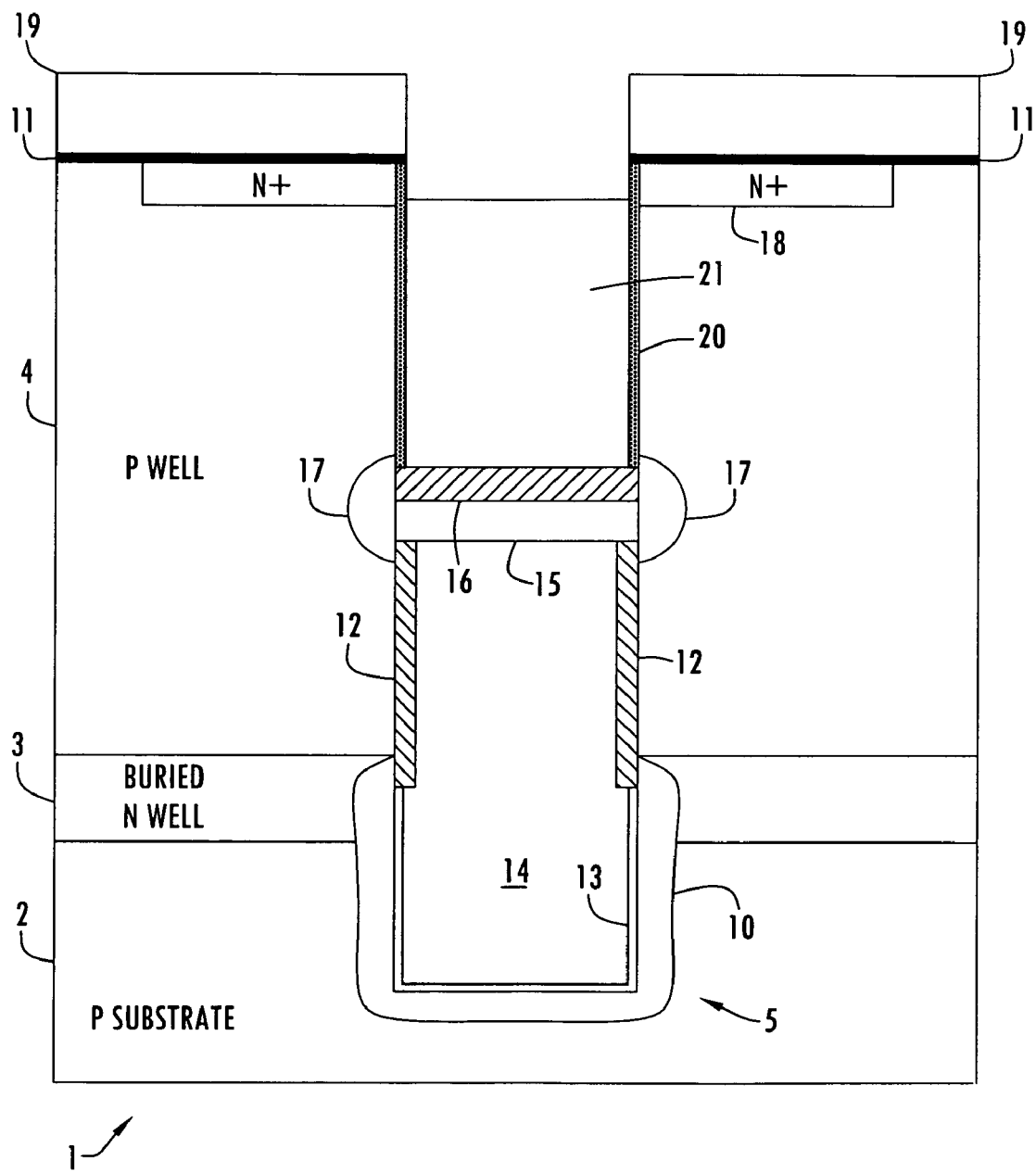
Figure 1C:
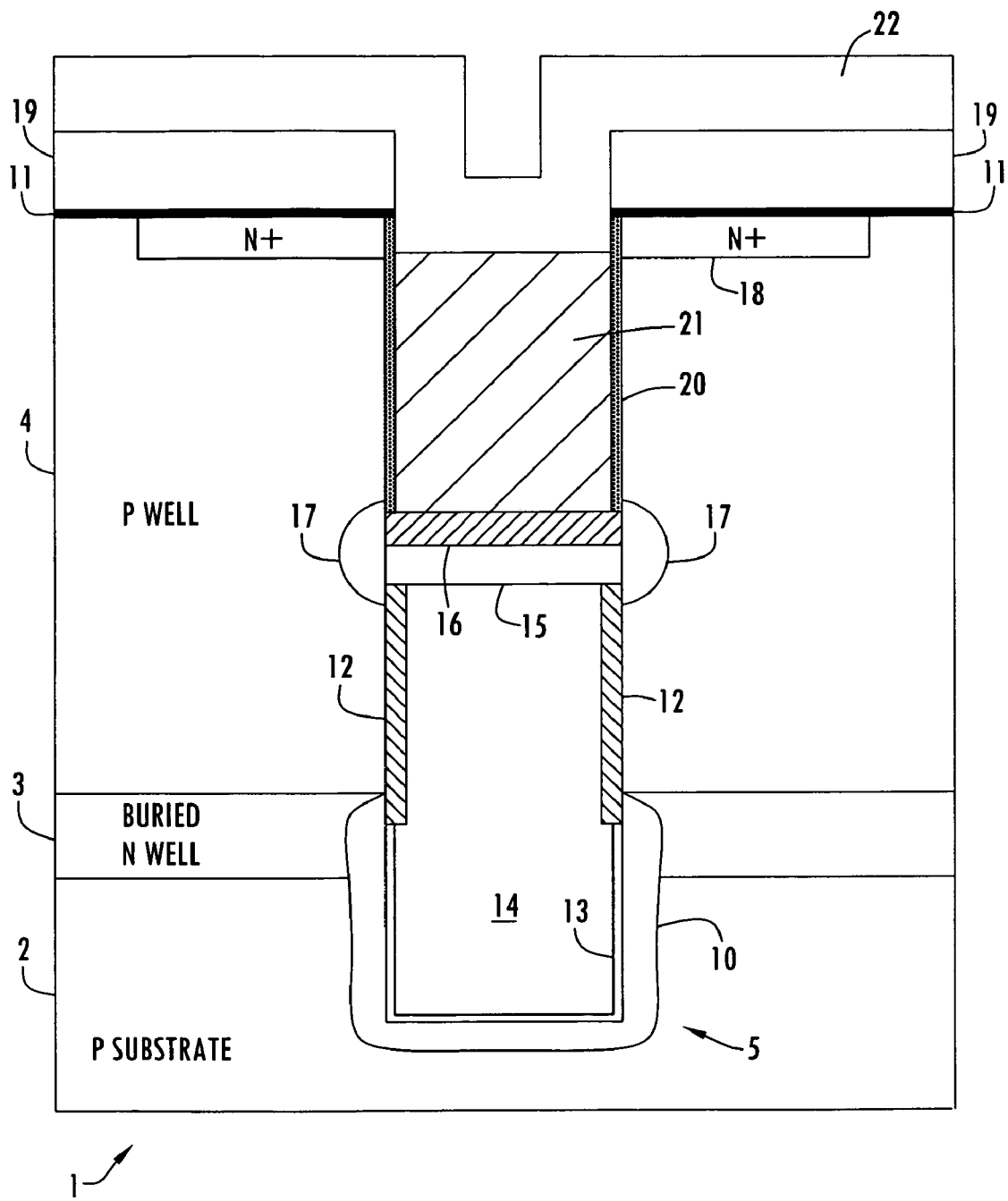
Figure 1D:
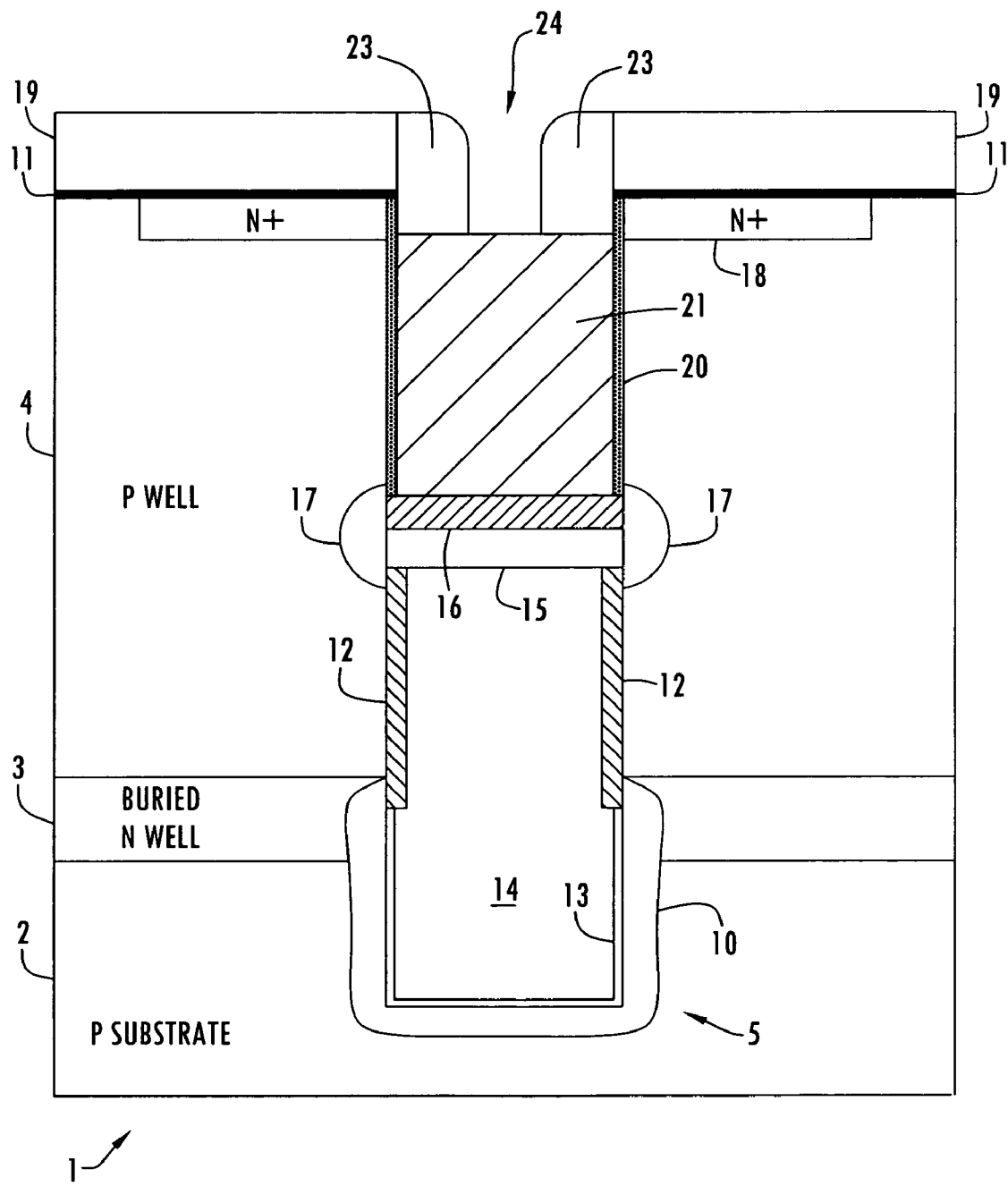
Figure 1E:
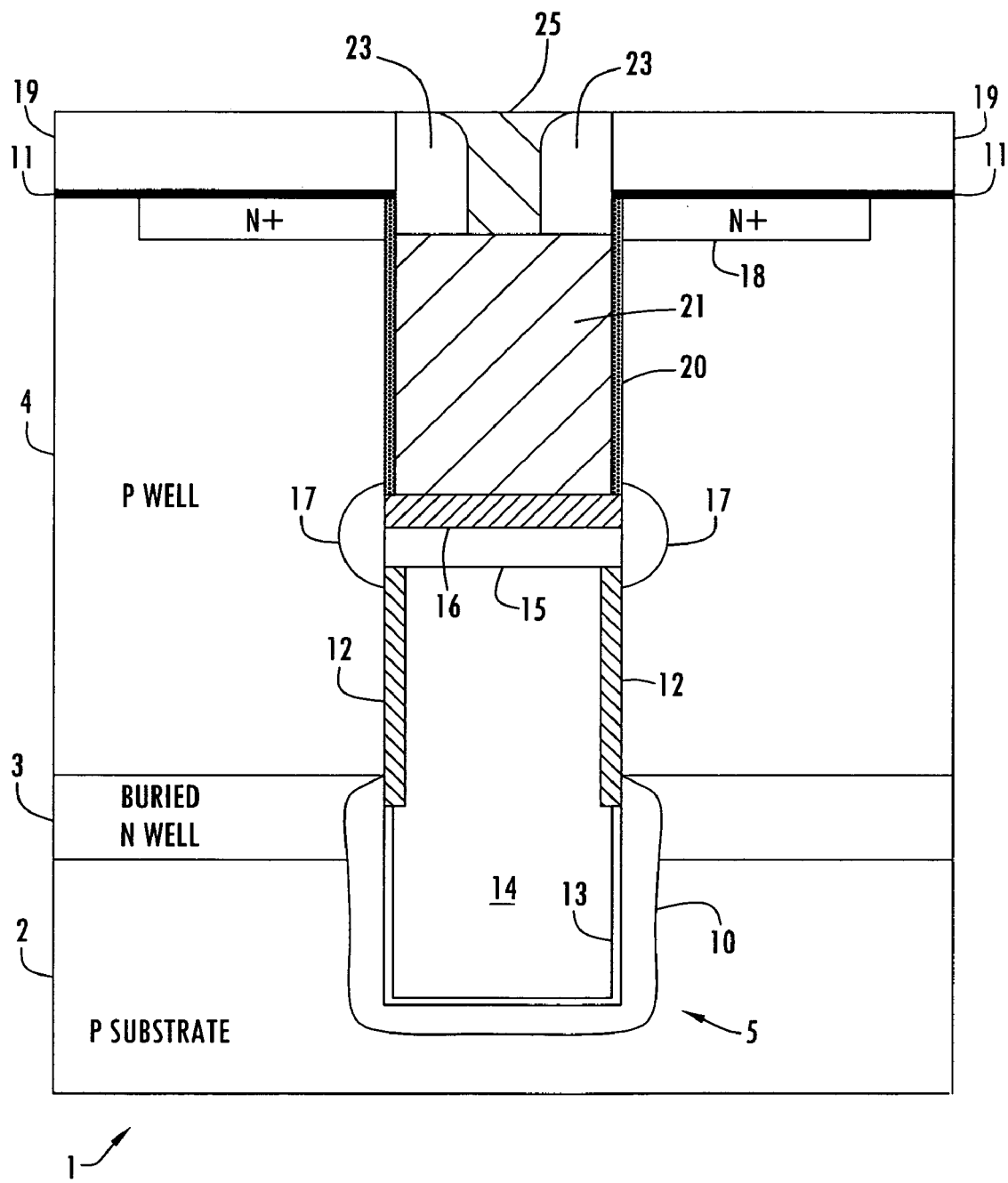
Figure 1F:
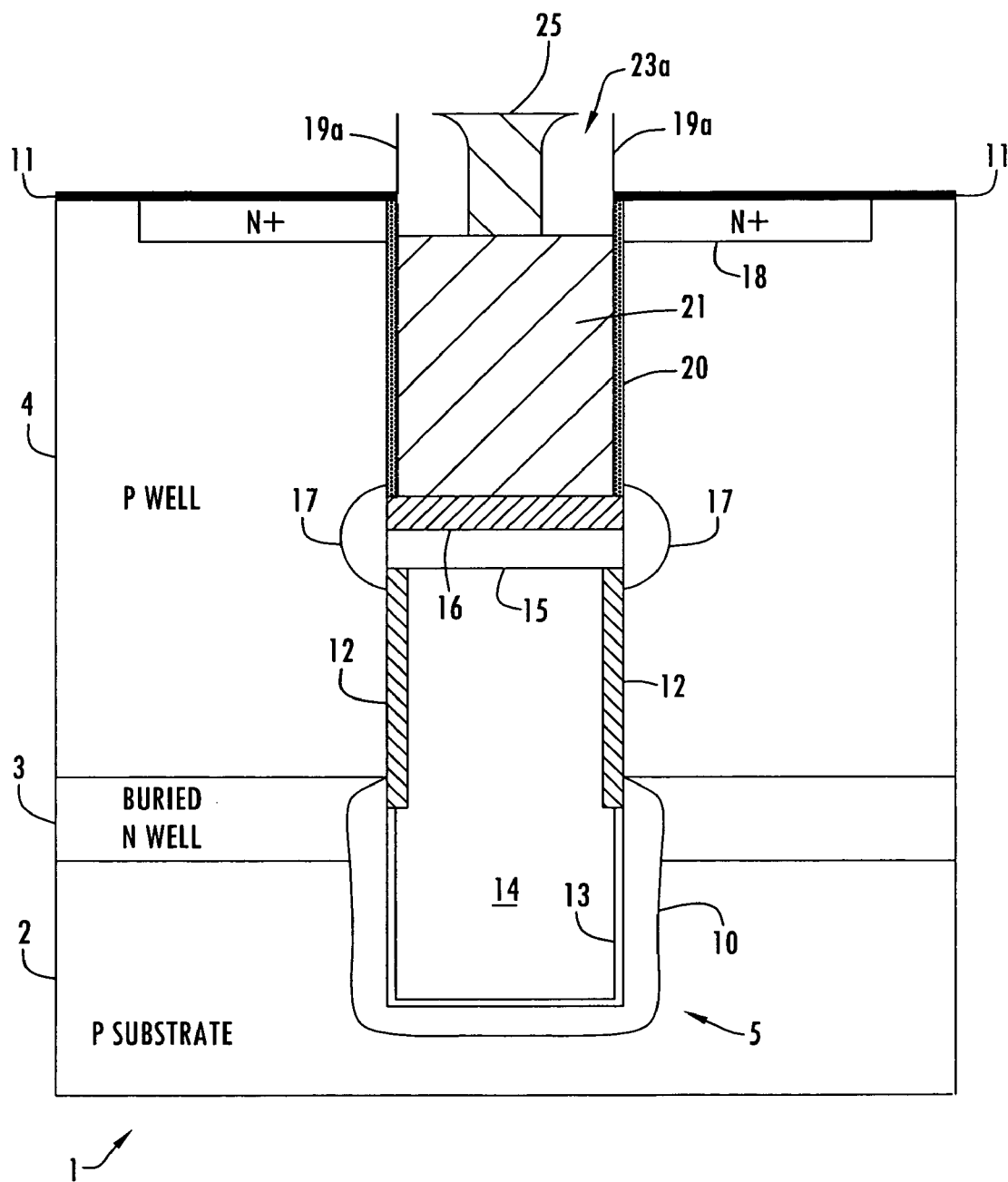
Figure 1G:
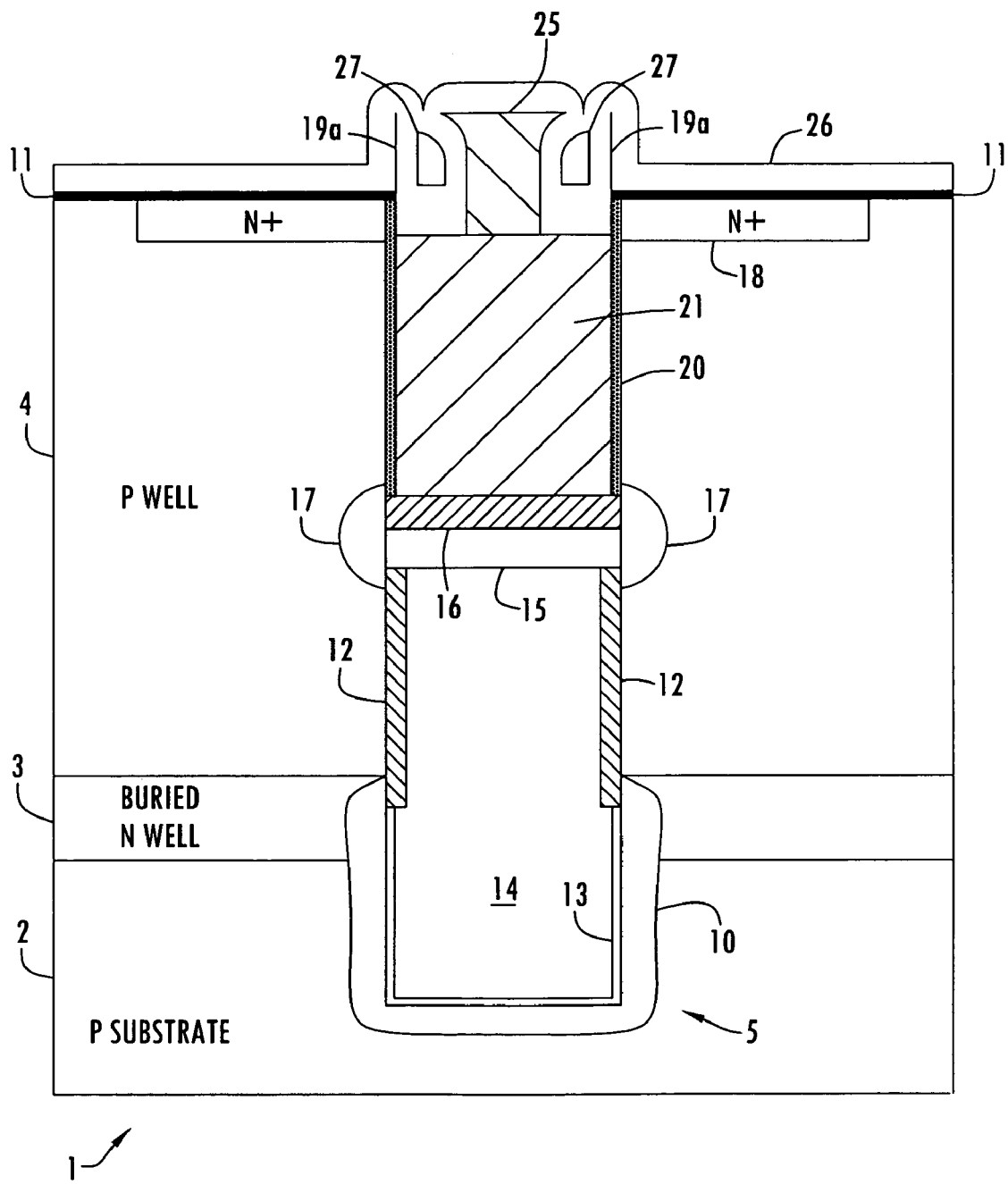
Figure 1H:
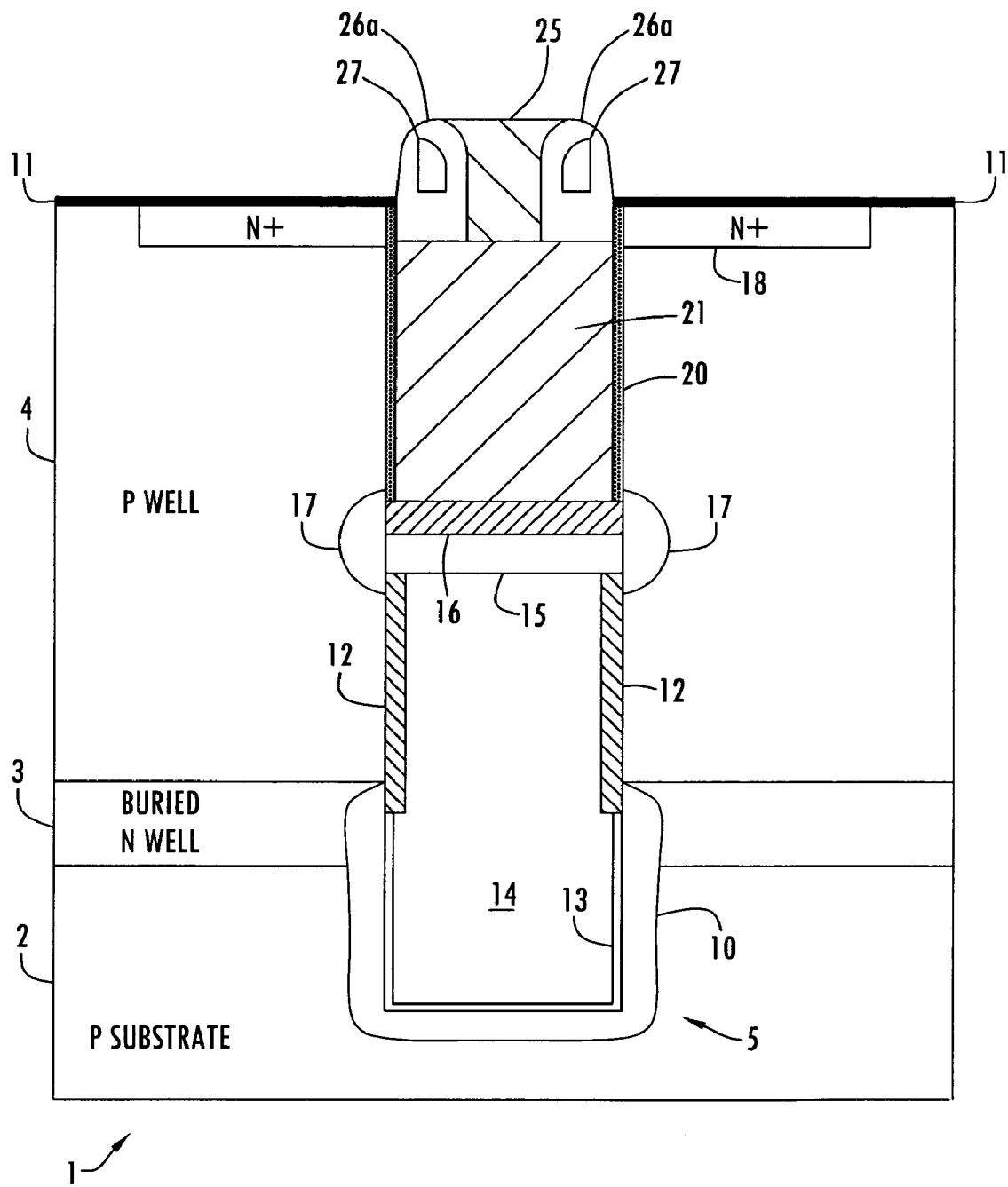

FIG. 2A is to be contrasted with the conventional process as depicted in FIG. 1B, where the polysilicon layer is deposited and etched back such that upper portion of the trench (5) above the TTO (16) is filled with polysilicon (21) to a level that overlaps the diffusion regions (18).

Figure 2B:
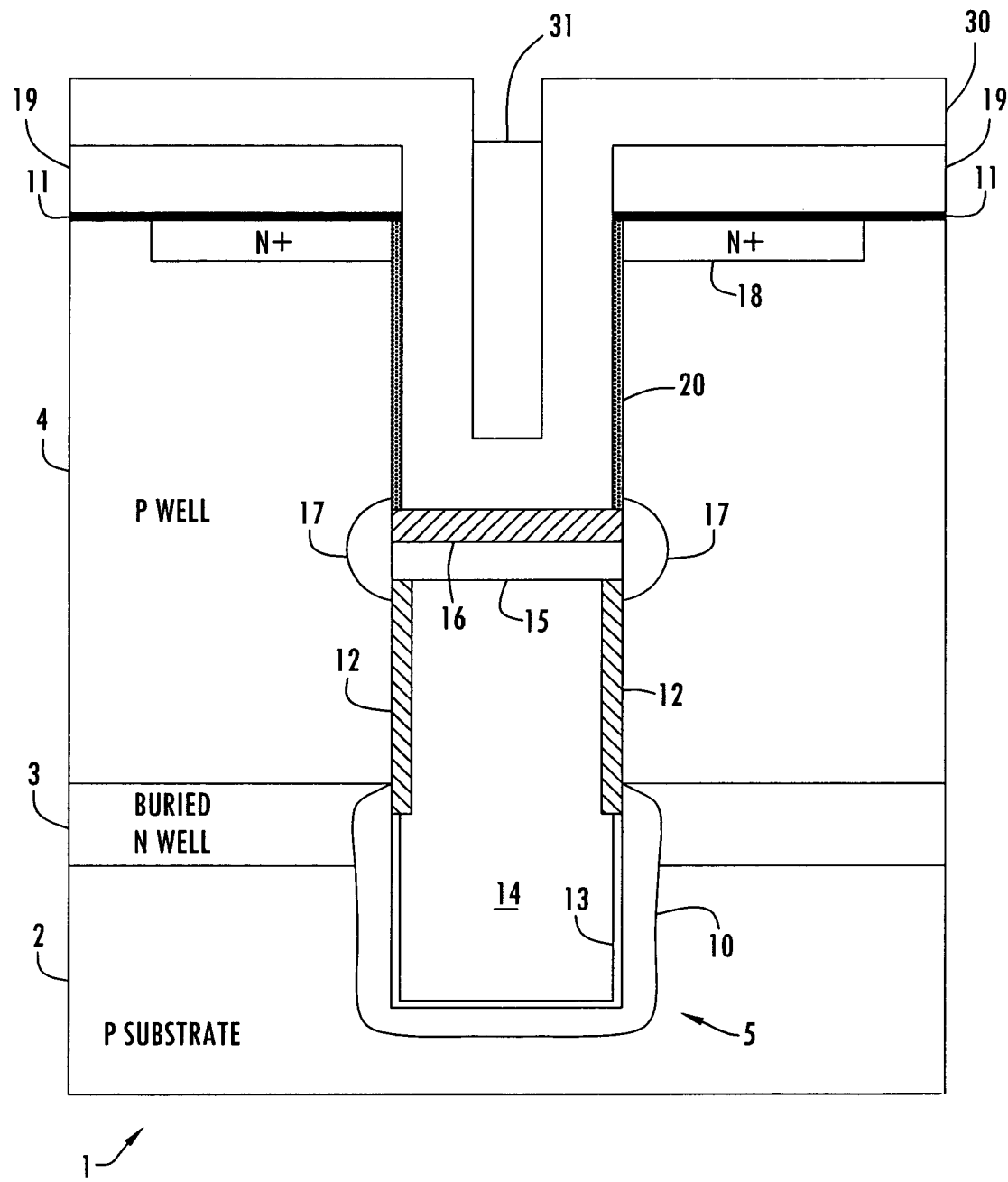

FIG. 2B is a cross-sectional view of the structure of FIG. 2A according to an exemplary embodiment of the invention, illustrating a nitride plug (31) that is formed in the aperture (28). More specifically, after deposition of the conformal polysilicon layer (30), in one exemplary embodiment, a nitride fill is performed to fill the aperture (28), as well as cover the conformal polysilicon layer formed over the pad nitride (19) outside the trench. Then, a nitride etch back (HF/EG) selective to polysilicon can be performed to etch the nitride layer such that the nitride is removed from the top of the polysilicon (30) and the nitride plug (31) is etched down to a level of the top surface of the pad nitride (19). Alternatively, a planarization process (CMP) can be used to remove the nitride layer down to the polysilicon layer (30), followed by a nitride etch to recess nitride plug (31) down to the level of the top surface of the pad nitride (19).

Figure 2C:
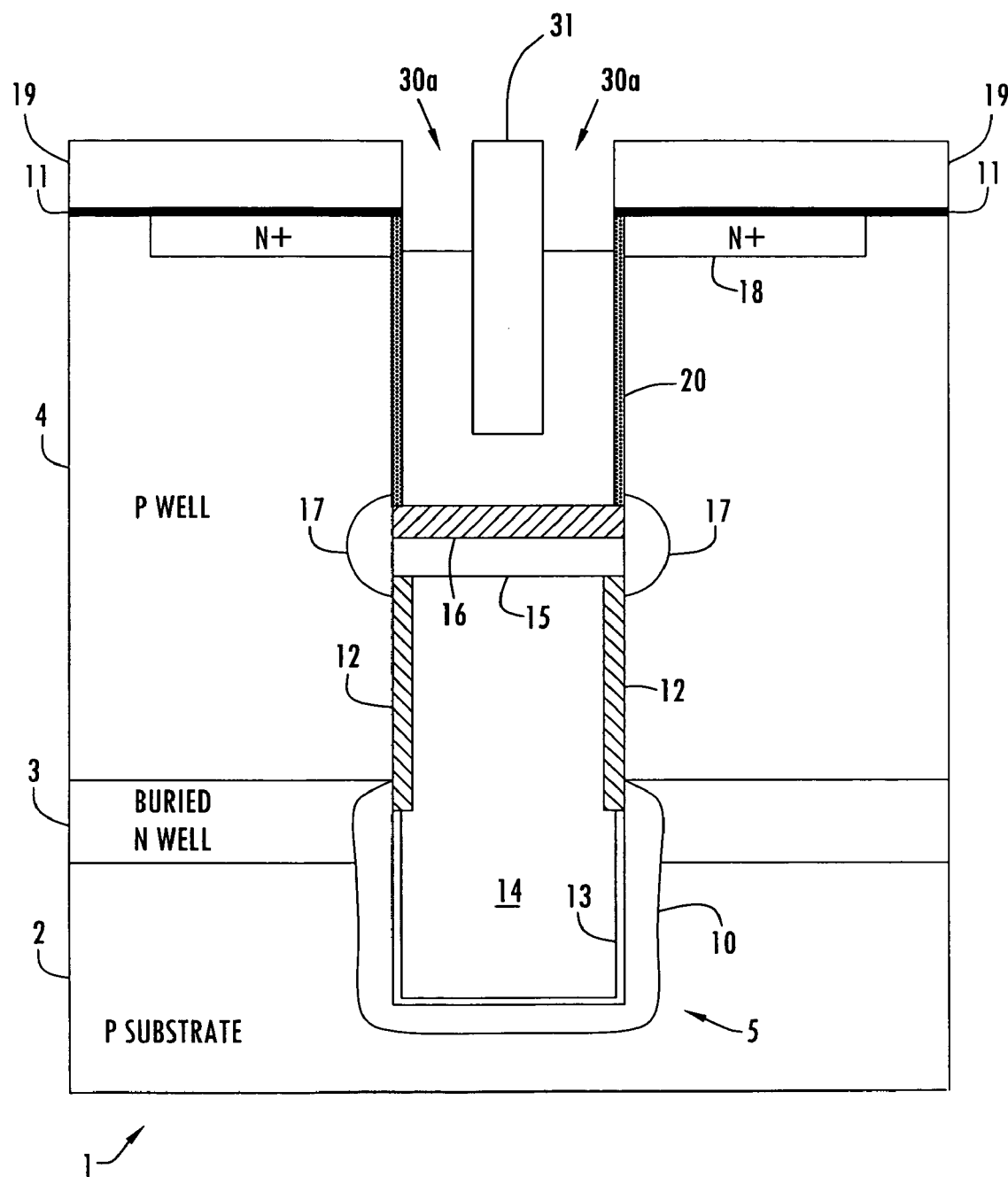

After the nitride plug (31) is formed, a next step is to perform a poly recess (using either a suitable wet or dry etch process selective to nitride) to remove the conformal polysilicon layer (30) on top of the pad nitride (19) and to recess the polysilicon layer (30) on the vertical sidewalls of the trench below the surface of the silicon. FIG. 2C is a cross-sectional view of the structure of FIG. 2B according to an exemplary embodiment of the invention, illustrating divots (30a) that are formed by etching or recessing the polysilicon layer (30) to a level below the surface of the substrate (1) and overlapping the diffusion regions (18). For example, in one exemplary embodiment of the invention, the depth of the diffusion region (18) is about 100 nm below the substrate surface, and the polysilicon (30) is recessed to a depth in the range of about 70 nm to less than 100 nm below the substrate surface (1). As explained below, oxide spacers are formed in the divots (30a).

At this point in the exemplary process, a conventional AA (active area) patterning process may be performed. For example, an oxide mask (AA TEOS mask) can be formed for AA patterning, wherein an oxide layer is deposited over the substrate and a resist layer is deposited over the oxide layer and exposed in an AA lithography step. An isolation trench mask is patterned into the resist, and the resist pattern is used for patterning the oxide layer to form an oxide mask. The oxide mask is then used for a STI (shallow trench isolation) process, as is understood by those of ordinary skill in the art.

Figure 2D:
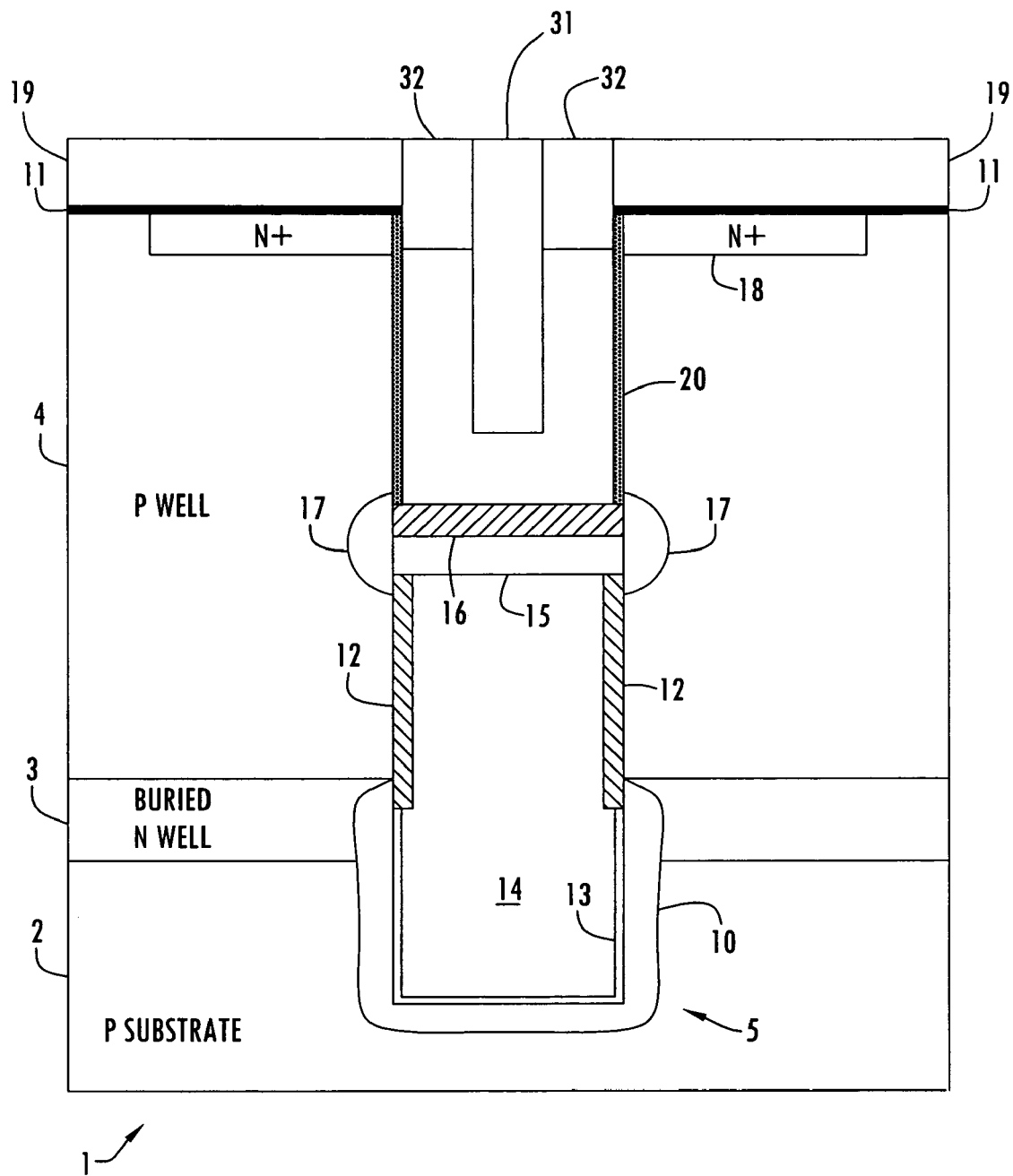

FIG. 2D is a cross-sectional view of the structure of FIG. 2C according to an exemplary embodiment of the invention, illustrating oxide spacers (32) formed in the divots (30a). More specifically, in one exemplary embodiment, the oxide spacers (32) are formed by performing an oxide fill to fill the divots (30a) with oxide and form an oxide layer over the pad nitride (19), followed by planarization of the oxide down to the surface of the pad nitride (19) to form oxide spacers (32). In one exemplary embodiment, an oxide fill is performed using HDP (High Density Plasma), followed by CMP.

Figure 2E:
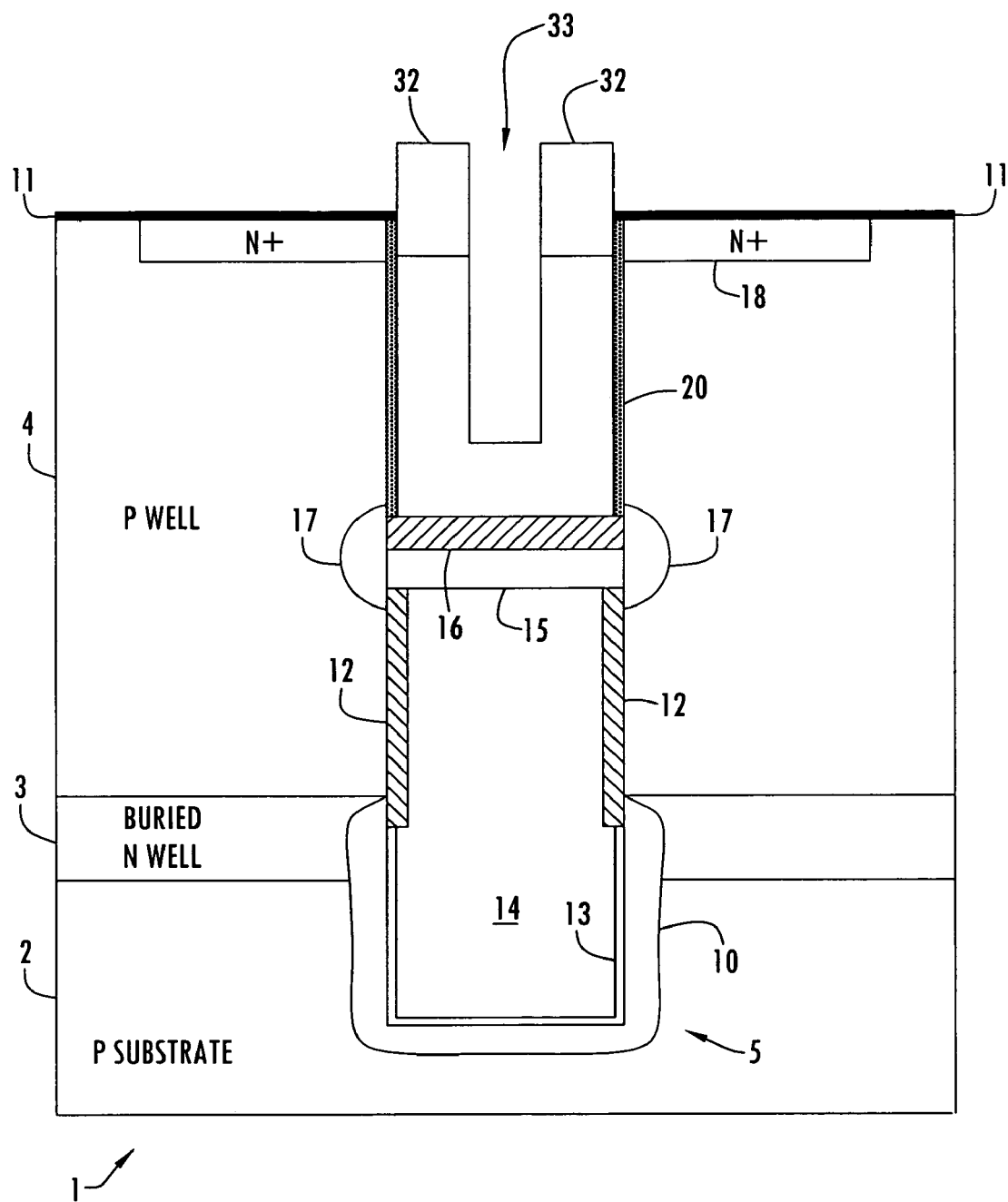

Next, a nitride etch process is performed to remove the pad nitride (19) and the nitride plug (31). FIG. 2E is a cross-sectional view of the structure of FIG. 2D according to an exemplary embodiment of the invention, illustrating an aperture (33) that is formed after selectively etching the nitride plug (31) and pad nitride (19) to remove such nitride plug and pads. In one exemplary embodiment, a nitride strip is performed using a wet process to etch nitride very selectively to oxide and poly, to thereby remove the pad nitride (19) and nitride plug (31) without affecting the oxide spacers (32), pad oxide layer (11), and the polysilicon (30).

Figure 2F:
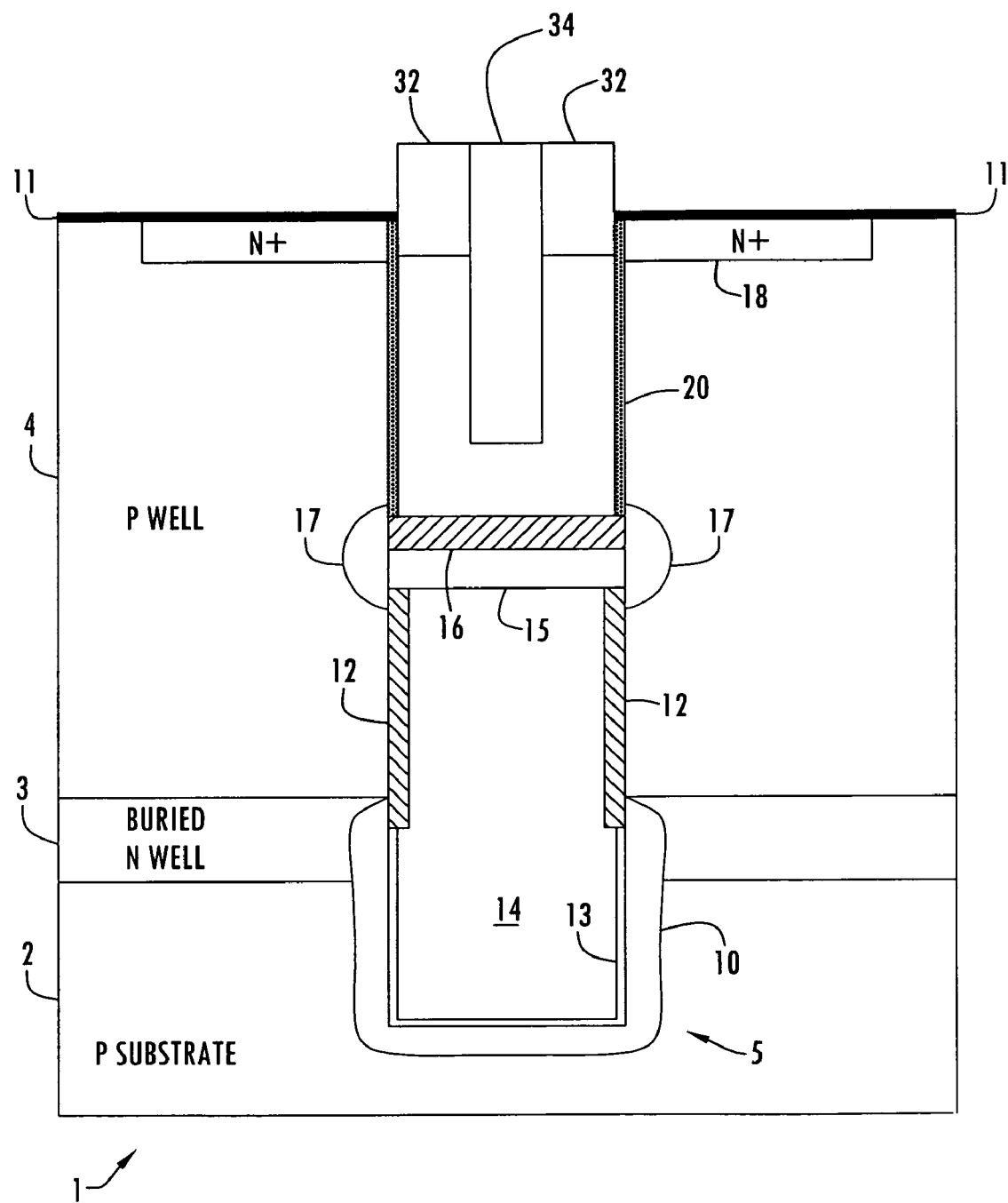

Then, another layer of polysilicon is deposited to fill the aperture (33). A polysilicon etch that is very selective to oxide is performed to remove the polysilicon on the surface of the substrate, without affecting the oxide plug (32) and the pad oxide (33) on the substrate (1) surface. FIG. 2F is a cross-sectional view of the structure of FIG. 2E according to an exemplary embodiment of the invention, illustrating a gate poly contact plug (34) (or poly plug) that is formed in the aperture (33) as a result of the deposition and etch back of a polysilicon layer. The contact plug (34) becomes integral with the poly underfill layer (30). It is to be understood that the contact plug (34) may be formed of suitable conductive materials other than polysilicon, such as tungsten silicide (WSi) or tungsten (W), and nothing herein shall be construed as placing a limitation on the scope of the invention.

The process continues in a conventional manner, including steps such as forming a contact to the gate polysilicon (via the contact plug (34) and connecting the gate poly to a wordline, forming a contact to the diffusion regions (18) and connecting the diffusion regions (18) to a bit line, etc.

Advantageously, exemplary methods and devices according to the present invention avoid the failure mechanisms which are created using nitride spacers, such as with the conventional process and devices described above (FIGS. 1A–1H). For instance, exemplary methods and devices according to the invention utilize a gate poly isolation process that is not sensitive to etch processes that can result in defects that cause, for example, bit line to gate poly shorts, as in a conventional process that uses nitride spacers. In an exemplary embodiment of the invention as described above, an oxide spacer formation process is employed to replace the conventional nitride spacer formation process that may cause device defects (e.g., electrical shorts) due to oxide residuals that are formed during the conventional process, which can result in the formation of voids nitride spacers that can be filled with conductive poly.

Furthermore, an oxide spacer formation process enables subsequent formation of a gate poly contact plug having vertical sidewalls, thereby providing gate poly contact plugs having well-defined structures to enable accurate alignment of the gate poly contact plug to, e.g., wordline contacts. This is to be contrasted with a conventional process (such as described above) in which nitride spacer formation results in nitride spacers that are rounded at top, thereby providing gate poly contact plugs not having well-defined structures, which can result in misalignment of the gate poly contact plug to, e.g., wordline contacts.

Although illustrative embodiments of the present invention have been described herein with reference to the accompanying drawings, it is to be understood that the invention is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:

1. A method for forming a vertical gate contact structure, comprising:
   forming a trench in a semiconductor substrate;
   forming a gate oxide on sidewalls of the trench;
   depositing a conformal layer of conductive material to cover the substrate and underfill the trench with the conductive material, wherein the conformal layer of conductive material forms a first aperture in a central region of the trench, the first aperture extending from a top surface of the conformal layer of conductive material into the trench;
   forming a nitride plug in the first aperture;
   etching the conformal layer of conductive material to recess the conductive material underfill in the trench to a depth below a surface of the semiconductor substrate to form a divot;
   filling the divot with an oxide material to form an oxide spacer;
   removing the nitride plug to form a second aperture in the central region of the trench, the second aperture extending from a top surface of the oxide spacer into the trench; and
   forming a gate contact plug in the second aperture, wherein the gate contact plug contacts the conductive material underfill in the trench.

2. The method of claim 1, wherein the first aperture has a width equal to about one-third a feature size of the trench.

3. The method of claim 1, wherein the conductive material comprises polysilicon.

4. The method of claim 1, wherein forming a nitride plug in the first aperture comprises:
   performing a nitride fill to overfill the first aperture and form a nitride layer over the conformal layer of conductive material outside the trench; and
   etching the nitride layer to remove the nitride layer and recess the nitride plug to a desired depth in the first aperture.

5. The method of claim 4, wherein etching the nitride layer comprises using a wet etch selective to the conductive material of the conformal layer.

6. The method of claim 5, wherein etching the nitride comprising polishing the nitride down to a surface of the conformal layer of conductive material outside the trench, followed by a wet etch.

7. The method of claim 1, wherein etching the conformal layer of conductive material is performed using a dry or wet etch selective to nitride, and wherein the conductive material underfill in the trench is recessed to a depth that overlaps a diffusion region in the substrate adjacent the trench.

8. The method of claim 1, wherein filling the divot with an oxide material to form an oxide spacer comprises performing an oxide fill to overfill the divot, and planarizing the oxide down to a nitride pad layer formed over the substrate.

9. The method of claim 8, wherein the oxide fill is performed using a HDP (high density plasma) process.

10. The method of claim 1, wherein removing the nitride plug is performed using a nitride etch highly selective to oxide.

11. The method of claim 1, wherein forming a gate contact plug in the second aperture comprises depositing a second layer of conductive material to overfill the second aperture and performing an etch selective to oxide to remove the conductive material on the substrate outside the trench.

12. The method of claim 1, wherein the gate contact plug is formed having substantially vertical sidewalls.

13. The method of claim 1, wherein the method is used for forming a vertical transistor of a deep trench memory cell.

14. A method for forming a deep trench memory cell, comprising:

forming a trench in a semiconductor substrate;

forming a trench capacitor having a storage node in a bottom portion of the trench;

forming a buried strap in the trench and forming an access node in the substrate adjacent the buried strap, the buried strap providing electrical connection between the access node and the storage node;

forming an isolation layer that isolates the buried strap and the storage node in the bottom trench portion from an upper trench portion; and forming a vertical gate contact structure for a vertical transistor in an upper trench portion above the isolation layer, wherein the gate contact structure comprises a gate contact plug at the surface of the substrate in the trench, the gate contact structure having vertical sidewalls as defined by an oxide spacer formed adjacent thereto, and wherein forming the vertical gate contact structure includes forming the gate oxide on sidewalls of the upper trench portion; depositing a conformal layer of conductive material to cover the substrate and underfill the upper trench portion with the conductive material, wherein the conformal layer of conductive material forms a first aperture in a central region of the upper trench portion, the first aperture extending from a top surface of the conformal layer of conductive material into the upper trench portion; forming a nitride plug in the first aperture; etching the conformal layer of conductive material to recess the conductive material underfill in the upper trench portion to a depth below a surface of the semiconductor substrate to form a divot; filling the divot with an oxide material to form an oxide spacer; removing the nitride plug to form a second aperture in the central region of the upper trench portion, the second aperture extending from a top surface of the oxide spacer into the upper trench portion; and forming a gate contact plug in the second aperture, wherein the gate contact plug contacts the conductive material underfill in the upper trench portion.

15. The method of claim 14, further comprising forming a wordline contact to the gate contact plug and isolating the gate contact plug and wordline contact from a bitline contact.

* * * * *